(12) United States Patent
Kim et al.

(10) Patent No.: US 8,780,584 B2
(45) Date of Patent: Jul. 15, 2014

(54) PRINTED CIRCUIT BOARD AND ELECTRO APPLICATION

(71) Applicant: Samsung Electro-Mechanics Co., Ltd., Gyunggi-do (KR)

(72) Inventors: Han Kim, Yongin-si (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/856,118

(22) Filed: Apr. 3, 2013

(65) Prior Publication Data

US 2013/0229779 A1    Sep. 5, 2013

Related U.S. Application Data

(62) Division of application No. 12/654,541, filed on Dec. 22, 2009, now Pat. No. 8,432,706.

(30) Foreign Application Priority Data

Jul. 29, 2009    (KR) .................. 10-2009-0069666

(51) Int. Cl.
*H05K 9/00* (2006.01)
*H05K 1/02* (2006.01)
*H01Q 1/52* (2006.01)

(52) U.S. Cl.
CPC ............ *H05K 1/0236* (2013.01); *H05K 1/0237* (2013.01); *H05K 1/0224* (2013.01); *H05K 1/0298* (2013.01); *H05K 2201/09681* (2013.01); *H01Q 1/526* (2013.01); *H01L 2924/3025* (2013.01)

USPC .......... 361/818; 361/788; 361/782; 174/250; 174/255; 174/260; 174/261; 174/262; 172/376; 172/377; 257/275; 257/533; 257/595; 257/664; 257/665; 333/12; 333/212; 333/238; 333/246; 343/702; 343/767; 343/909; 327/551

(58) Field of Classification Search
CPC . H05K 1/0236; H05K 1/0237; H05K 1/0224; H05K 1/0298; H05K 2201/09681; H01Q 1/526; H01L 2924/3025
See application file for complete search history.

(56) References Cited

U.S. PATENT DOCUMENTS 6,377,464 B1    4/2002    Hashemi et al.
7,030,463 B1    4/2006    Subramanyam et al.
(Continued)

FOREIGN PATENT DOCUMENTS

CN    101365293        2/2009
CN    101365293 A      2/2009
(Continued)

OTHER PUBLICATIONS

English Translation of Chinese Office Action mailed Mar. 7, 2013 for corresponding Chinese Application No. 200910261878.X.

(Continued)

*Primary Examiner* — Xiaoliang Chen (57) ABSTRACT

An electronic product includes a case; a first board placed inside the case; and a second board having an Electromagnetic Band Gap (EBG) structure inserted therein. The second board is coupled to an inside of the case facing the first board so as to shield a noise radiated from the first board.

3 Claims, 14 Drawing Sheets

(56) References Cited

U.S. PATENT DOCUMENTS

| | | |
|---|---|---|
| 7,102,581 B1 | 9/2006 | West |
| 7,136,029 B2 | 11/2006 | Ramprasad et al. |
| 7,215,007 B2 | 5/2007 | McKinzie et al. |
| 7,408,512 B1 | 8/2008 | Rodenbeck et al. |
| 7,733,265 B2 | 6/2010 | Margomenos et al. |
| 7,764,149 B2 | 7/2010 | Han et al. |
| 7,830,301 B2 | 11/2010 | Margomenos |
| 7,889,134 B2 | 2/2011 | McKinzie et al. |
| 8,022,861 B2 | 9/2011 | Marqrgomenos |
| 8,040,201 B2 | 10/2011 | Park et al. |
| 8,060,457 B2* | 11/2011 | Kim et al. ............... 706/13 |
| 8,081,052 B2 | 12/2011 | Kim et al. |
| 8,159,832 B2* | 4/2012 | Arslan et al. ............ 361/799 |
| 2003/0232603 A1 | 12/2003 | Tanaka et al. |
| 2005/0029632 A1 | 2/2005 | McKinzie et al. |
| 2005/0104678 A1 | 5/2005 | Shahparnia et al. |
| 2005/0205292 A1 | 9/2005 | Rogers et al. |
| 2005/0224912 A1 | 10/2005 | Rogers et al. |
| 2006/0050010 A1 | 3/2006 | Choi et al. |
| 2006/0092079 A1* | 5/2006 | de Rochemont ....... 343/700 MS |
| 2006/0092093 A1 | 5/2006 | Choi et al. |
| 2006/0232949 A1* | 10/2006 | Osaka ..................... 361/788 |
| 2007/0001926 A1 | 1/2007 | Waltho |
| 2007/0090398 A1 | 4/2007 | McKinzie, III |
| 2007/0120223 A1 | 5/2007 | McKinzie et al. |
| 2007/0215913 A1* | 9/2007 | Okubora ................. 257/275 |
| 2007/0285188 A1* | 12/2007 | Song et al. ............. 333/12 |
| 2007/0289771 A1* | 12/2007 | Osaka et al. ........... 174/250 |
| 2008/0001843 A1 | 1/2008 | Wu et al. |
| 2008/0068818 A1 | 3/2008 | Choi |
| 2008/0072204 A1* | 3/2008 | Chen ...................... 716/15 |
| 2008/0129626 A1 | 6/2008 | Wu et al. |
| 2008/0158840 A1 | 7/2008 | Chen et al. |
| 2008/0204127 A1* | 8/2008 | Choi ....................... 327/551 |
| 2008/0264685 A1 | 10/2008 | Park et al. |
| 2008/0266018 A1 | 10/2008 | Han et al. |
| 2008/0266026 A1 | 10/2008 | Han et al. |
| 2008/0314634 A1 | 12/2008 | Kim et al. |
| 2009/0011922 A1* | 1/2009 | de Rochemont ......... 501/137 |
| 2009/0038840 A1 | 2/2009 | Kim et al. |
| 2009/0039984 A1 | 2/2009 | Kim et al. |
| 2009/0071603 A1 | 3/2009 | Koo et al. |
| 2009/0071709 A1 | 3/2009 | Han et al. |
| 2009/0080172 A1 | 3/2009 | Arslan et al. |
| 2009/0084582 A1 | 4/2009 | Kim et al. |
| 2009/0085691 A1 | 4/2009 | Kim et al. |
| 2009/0086451 A1 | 4/2009 | Kim et al. |
| 2009/0135570 A1 | 5/2009 | Chou et al. |
| 2009/0145646 A1 | 6/2009 | Han et al. |
| 2009/0236141 A1* | 9/2009 | Kim et al. ............... 174/360 |
| 2009/0260864 A1 | 10/2009 | Lee |
| 2009/0308653 A1* | 12/2009 | Wu ......................... 174/377 |
| 2009/0315648 A1* | 12/2009 | Toyao ..................... 333/238 |
| 2009/0322450 A1* | 12/2009 | Kim et al. ............... 333/204 |
| 2010/0053013 A1* | 3/2010 | Konishi et al. .......... 343/772 |
| 2010/0060527 A1* | 3/2010 | Kim et al. .......... 343/700 MS |
| 2010/0084176 A1* | 4/2010 | Kim .......................... 174/261 |
| 2010/0085128 A1 | 4/2010 | Cho et al. |
| 2010/0108373 A1* | 5/2010 | Park ........................... 174/376 |
| 2010/0127345 A1* | 5/2010 | Sanders et al. .............. 257/528 |
| 2010/0127790 A1* | 5/2010 | Bong et al. .................. 333/12 |
| 2010/0132996 A1 | 6/2010 | Han et al. |
| 2010/0134200 A1 | 6/2010 | Koo et al. |
| 2010/0167666 A1 | 7/2010 | Choudhury et al. |
| 2010/0214178 A1* | 8/2010 | Toyao et al. ................ 343/702 |
| 2010/0265159 A1 | 10/2010 | Ando et al. |
| 2011/0012697 A1 | 1/2011 | Takemura et al. |
| 2011/0061925 A1 | 3/2011 | Kim et al. |
| 2011/0067914 A1 | 3/2011 | Jung et al. |
| 2011/0067915 A1 | 3/2011 | Kim et al. |
| 2011/0069470 A1* | 3/2011 | Bong et al. ................. 361/818 |
| 2011/0299264 A1* | 12/2011 | Kim et al. .................. 361/818 |

FOREIGN PATENT DOCUMENTS

| | | |
|---|---|---|
| CN | 101453828 | 6/2009 |
| CN | 101453828 A | 6/2009 |
| DE | 102008003687 | 11/2008 |
| DE | 102008041072 | 2/2009 |
| JP | 2004-22587 | 1/2004 |
| JP | 2009-141326 | 6/2009 |
| TW | 200808136 | 2/2008 |
| TW | 200642558 | 5/2008 |
| WO | 2008/054324 | 5/2008 |
| WO | WO 2008/062562 | 5/2008 |
| WO | 2009/082003 | 7/2009 |
| WO | 2009/082003 A1 | 7/2009 |

OTHER PUBLICATIONS

Taiwan Office Action dated Sep. 13, 2012 in corresponding Taiwan Patent Application No. 098146470.
English Translation of Chinese Office Action issued Jul. 2, 2012 in corresponding Chinese Patent Application No. 200910261878.X.
German Office Action dated Jun. 12, 2012 issued in corresponding German Patent Application No. 102009055342.8.
Japanese Office Action mailed Jan. 31, 2012 issued in corresponding Japanese Patent Application No. 2009-295654.
U.S. Office Action mailed Feb. 2, 2012 in copending U.S. Appl. No. 12/654,541.
U.S. Office Action mailed May 29, 2012 in copending U.S. Appl. No. 12/654,541.
U.S. Notice of Allowance mailed Jan. 9, 2013 in copending U.S. Appl. No. 12/654,541.
U.S. Appl. No. 12/654,541, filed Dec. 22, 2009, Han Kim, Samsung Electro-Mechanics Co., Ltd.
Japanese Office Action issued Sep. 3, 2013 in corresponding Japanese Application No. 2012-099224.

* cited by examiner

PRINTED CIRCUIT BOARD AND ELECTRO APPLICATION

CROSS-REFERENCE TO RELATED APPLICATIONS

This application is a divisional of U.S. application Ser. No. 12/654,541, filed Dec. 22, 2009, which claims the benefit of Korean Patent Application No. 10-2009-0069666, filed with the Korean Intellectual Property Office on Jul. 29, 2009, the disclosures of which are incorporated herein by reference in their entirety.

BACKGROUND

1. Field

The present invention relates to a printed circuit board and an electronic product.

2. Description of the Related Art

As the operating frequencies of electronic products become higher, electromagnetic interference (EMI) has been perceived as a chronic noise problem. Particularly, the operating frequencies of electronic products have reached a few ten MHz, or even a few GHz, making the EMI problems more serious. Subsequently, finding a solution to the problems is desperately needed. Among the EMI problems occurring at a board, a solution for the noise problems particularly occurred at the edge of the board has not been sufficiently researched, making it difficult to completely block the noise at the board.

Figure 1:
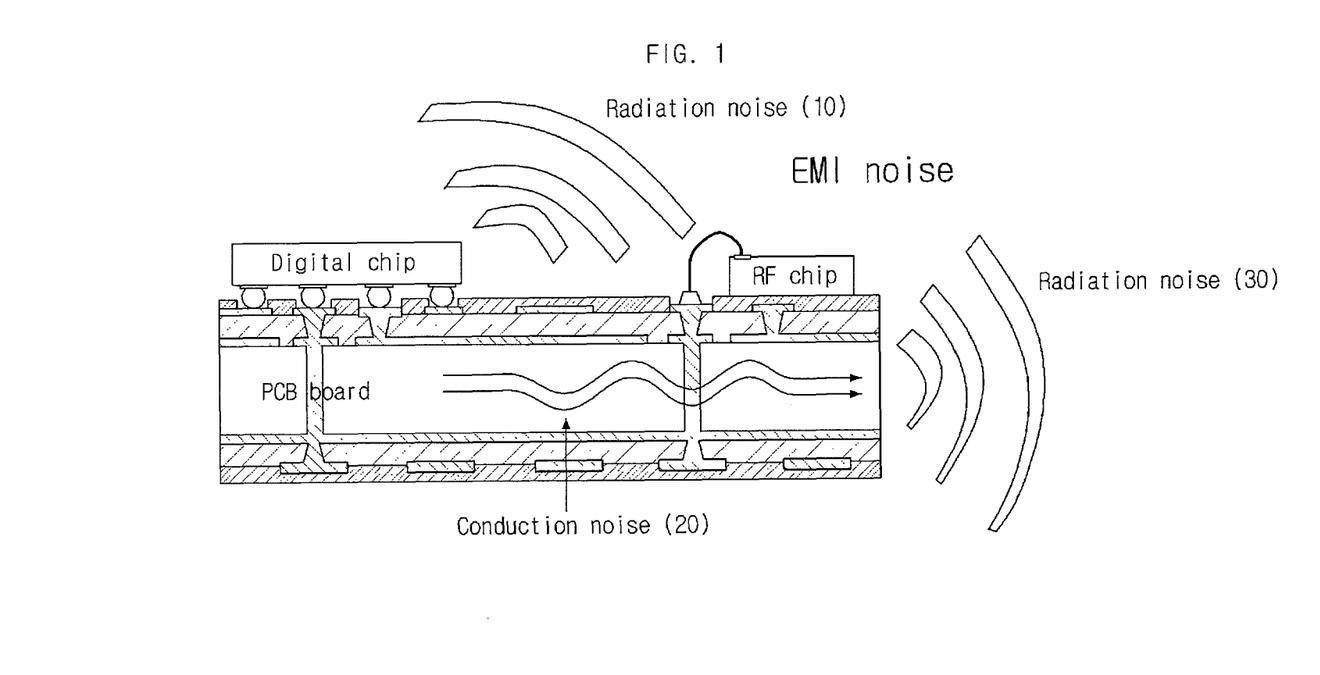
FIGS. 1 to 3 are cross-sectional views illustrating a printed circuit board in accordance with the related art.

EMI noise refers to a noise that creates a noise problem caused by interference when an electromagnetic (EM) wave generated in one electronic circuit, component or part is transferred to another electronic circuit, component or part. The EMI noise can be broadly categorized into two types, namely radiation noise (reference numerals 110 and 130 in FIG. 1) and conduction noise (reference numeral 120 in FIG. 1).

Figure 2:
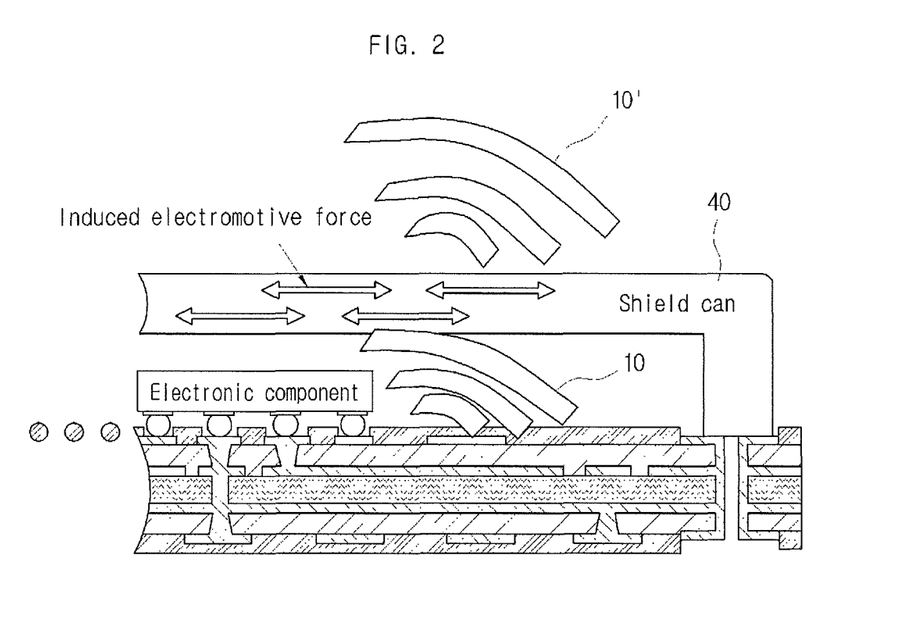
Figure 3:
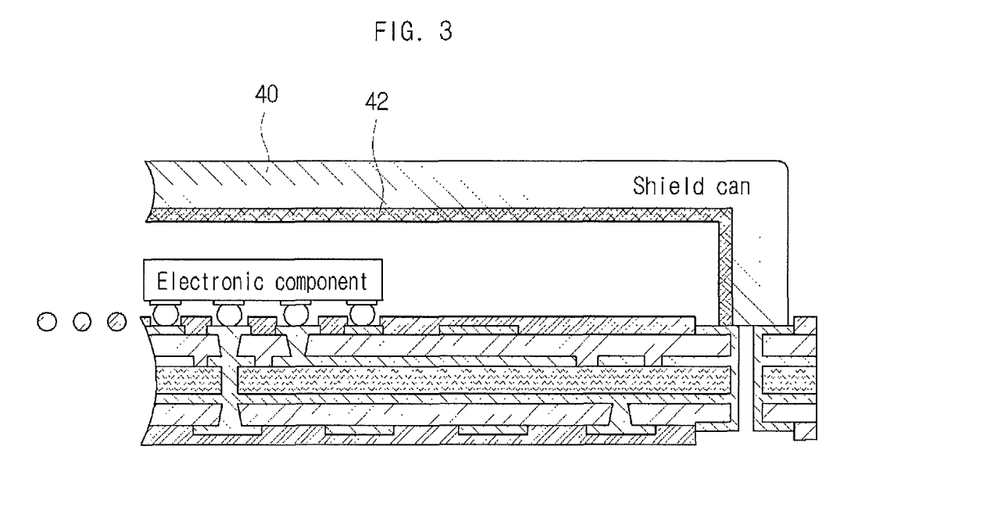

The EMI noise radiated from a board of an electronic product may be commonly shielded by covering an upper portion of the board by use of a shield can (40 of FIG. 2) or by absorbing the EMI noise by attaching an EMI field absorber (42 of FIG. 3). However, in the case of using the shield can 40, since a new radiation noise 10' is generated due to the antenna effect, it is difficult to shield all EMI noises radiated towards the outside of the board, and there are limitations to frequency ranges that can be absorbed by the EMI field absorber 42, making it urgently needed to find an effective shielding method.

The shield can 40 has some problems in attaching itself. Furthermore, not only is the thickness of the shield can restricted, but also the shield can increases the weight of a lightweight electronic device. Also, in the case of the EMI field absorber 42, it is difficult to develop a material that can shield the EMI noise in various frequencies, and it may take longer to develop the material, thereby increasing the production cost.

Therefore, it is desperately needed to find a solution that can readily absorb various frequencies, be easy to apply without any antenna effect and be cost-effective in manufacturing.

SUMMARY OF THE INVENTION

The present invention provides a printed circuit board and an electronic product that can readily absorb various frequencies, be easily applied without any antenna effect and be cost-effective in manufacturing.

An aspect of the present invention provides a printed circuit board that includes a first board, which has an electronic component mounted thereon, and a second board, which is positioned on an upper side of the first board and covers at least a portion of an upper surface of the first board and in which an Electromagnetic Band Gap (EBG) structure is inserted into the second board such that a noise radiating upwards from the first board is shielded.

The second board can be adhered to the upper surface of the first board by way of adhesive, and can be coupled to a shield can covering at least a portion of the upper surface of the first board. Here, the shield can be connected to a ground of the first board, and the EBG structure of the second board can be grounded to the shield can. Also, an open hole can be formed in the shield can, and the second board can be coupled to a portion of the shield can in such a way that the open hole is covered. Here, the open hole can be formed in an upper surface of the electronic component.

The electronic component can be mounted on a surface of the first board, and the second board can be stacked on the upper surface of the first board while a portion corresponding to the position of the electronic component is opened.

The second board can include a first conductive body and a second conductive body, which are disposed on a different surface, respectively, a third conductive body, which is disposed on a surface that is different from that of the second conductive body, and a stitching via unit, which connects the first conductive body to the third conductive body through the surface on which the second conductive body is disposed and in which the stitching via is electrically separated from the second conductive body.

The second board can include a pair of fourth conductive bodies, which are separately disposed on a same surface, a fifth conductive body, which is disposed on a surface that is different from that of the fourth conductive bodies, a sixth conductive body, which is disposed on a surface between the fourth conductive bodies and the fifth conductive body, and a stitching via unit, which connects the pair of fourth conductive bodies to each other through the fifth conductive body and in which the stitching via unit is electrically separated from the sixth conductive body.

The second board can also have a bent shape corresponding to the shape of the first board.

Another aspect of the present invention provides an electronic product that includes a case, a first board, which is placed inside the case, and a second board, which has an EBG structure inserted therein and in which the second board is coupled to an inside of the case facing the first board so as to shield a noise radiated from the first board.

The second board can include a first conductive body and a second conductive body, which are disposed on a different surface, respectively, a third conductive body, which is disposed on a surface that is different from that of the second conductive body, and a stitching via unit, which connects the first conductive body to the third conductive body through the surface on which the second conductive body is disposed and in which the stitching via is electrically separated from the second conductive body.

The second board can include a pair of fourth conductive bodies, which are separately disposed on a same surface, a fifth conductive body, which is disposed on a surface that is different from that of the fourth conductive bodies, a sixth conductive body, which is disposed on a surface between the fourth conductive bodies and the fifth conductive body, and a stitching via unit, which connects the pair of fourth conductive bodies to each other through the fifth conductive body and in which the stitching via unit is electrically separated from the sixth conductive body.

The second board can have a bent shape corresponding to the shape of the first board.

Additional aspects and advantages of the present invention will be set forth in part in the description which follows, and in part will be apparent from the description, or may be learned by practice of the invention.

BRIEF DESCRIPTION OF THE DRAWINGS

These and/or other aspects of the disclosure will become apparent and more readily appreciated from the following description of the embodiments, taken in conjunction with the accompanying drawings of which.

DESCRIPTION OF EMBODIMENTS

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

A printed circuit board and an electronic product according to certain embodiments of the present invention will be described below in more detail with reference to the accompanying drawings. Those components that are the same or are in correspondence are rendered the same reference numeral regardless of the figure number, and redundant descriptions are omitted.

A printed circuit board according to an embodiment of the present invention provides a structure in which an EMI noise radiated from an electronic component 110 or a driving circuit driving the electronic component 110 that is mounted on a board can be shielded by covering the upper surface of the board, on which the electronic component 110 is mounted, with another board into which an Electromagnetic Band Gap (EBG) structure is inserted. For this, the printed circuit board according to an embodiment of the present invention includes a first board 100, which has the electronic component 110 mounted thereon, and a second board 200, which is positioned on an upper surface of the first board 100 and covers at least a portion of the upper surface of the first board 100 and in which an EBG structure (refer to the reference numerals 280a, 280b, 280c and 280d of FIGS. 10 to 14) is inserted in such a way that a noise radiating upwards from the first board 100 can be shielded.

The second board 200 is a separate board that is different from the first board 100, on which the electronic component 110 is mounted, and can shield a noise by having the EBG structures 280a, 280b, 280c and 280d inserted therein. Here, the EBG structure can be constituted by a metal layer, a via and a pattern, which are formed inside the board.

As such, the printed circuit board according to this embodiment can provide a desirable or even better noise shielding effect with lower costs than the case of using an absorber, by adding the second board 200 only without using an expensive absorber (42 of FIG. 3) so as to shield the noise radiating upwards from the first board 100. Also, this can provide a far better noise shielding effect than the conventional technology using a shield can (40 of FIG. 2) only because there is no antenna effect occurred.

Various possible embodiments of the EBG structure, which is inserted into the second board 200, will be described later.

Figure 4:
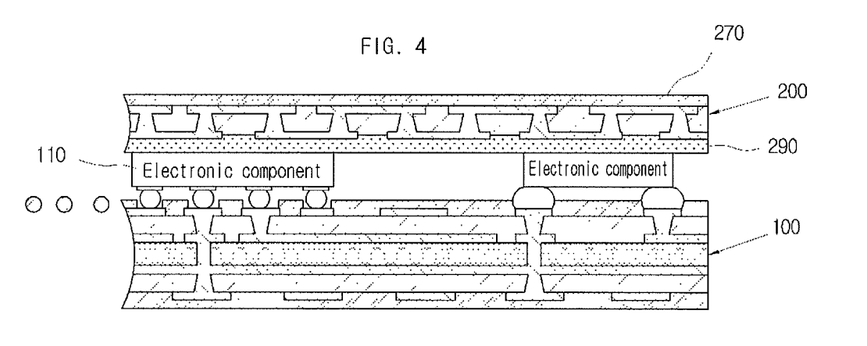
FIGS. 4 to 7 are cross-sectional views illustrating printed circuit boards in accordance with some embodiments of the present invention.

The second board 200 can be coupled to the upper surface of the first board 100 by use of an adhesive 290. More specifically, if the electronic component 110 is mounted on the surface of the first board 100, as illustrated in FIG. 4, the second board 200 can be coupled to the upper surface of the electronic component 110 through the adhesive 290. A solder resist 270 can be formed on an opposite surface on which the adhesive 290 is not coated so that the various patterns forming the EBG structure can be protected.

Figure 5:
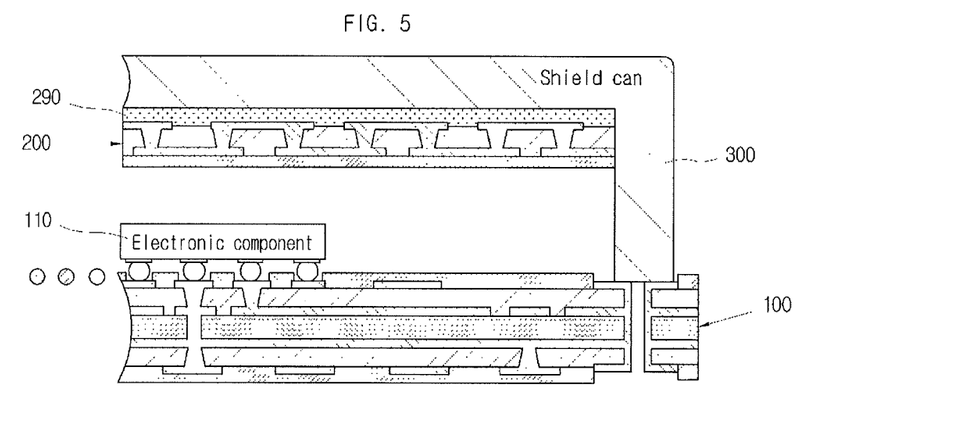

Meanwhile, as illustrated in FIG. 5, in case the upper surface of the first board 100 is covered by the shield can 300, the second board 200 can cover the upper surface of the first board 100 by being coupled to the shield can 300.

Also, in case the shield can 300 is connected to the ground of the first board 100 through a solder (not shown), the EBG structure can be connected to the ground (not shown) of the first board 100 by making the EBG structure of the second board 200 grounded to the shield can 300. With this configuration, the ground can be obtained more widely, thus improving the noise shielding effect.

Figure 6:
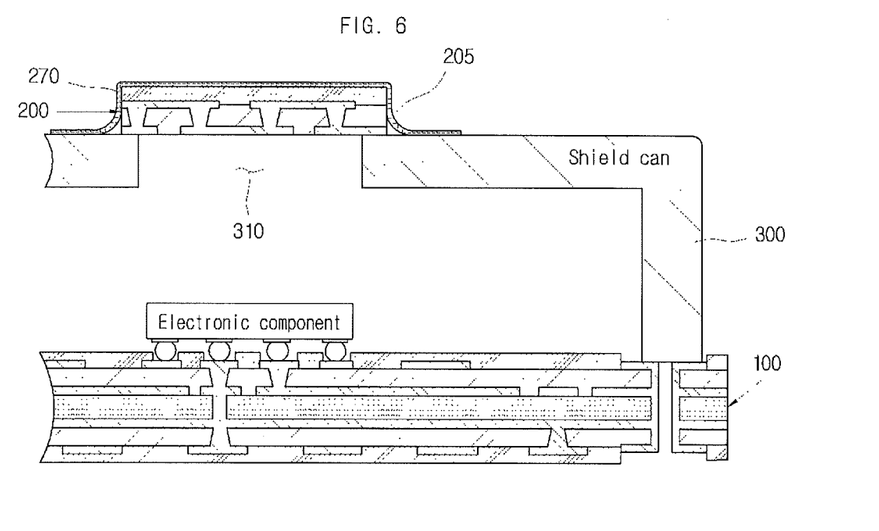

For this, as illustrated in FIG. 6, the second board 200 can be fixed to the shield can 300 by using a fixing means such as an adhesive tape 205 after a portion of the EBG structure of the second board 200, i.e., a metal layer or pattern, is disposed to be adhered to the shield can 300. In FIG. 6, the adhesive tape 205 covers the entire upper surface of the second board 200, but it shall be apparent that it can also cover a portion of the second board 200 only, depending on the design specifications.

Although the second board 200 can be coupled to the entire lower or upper surface of the shield can 300, it is also possible that the second board 200 is coupled to a certain portion of the shield can 300 only. In this case, as illustrated in FIG. 6, an open hole 310 can be formed in the shield can 300, and the second board 200 can be coupled so as to cover the open hole 310. As such, by selectively disposing the second board 200 on a certain portion, the noise in the portion desired by the user can be selectively shielded, and the excessive use of the second board 200 can be prevented so that cost-saving can be expected.

Considering that noise is usually radiated upwards from an electronic component, the open hole can be formed in a portion of the shield can that corresponds to the upper side of the electronic component. However, it shall be apparent that the present invention is not limited to this embodiment, and the position, number and shape of the open hole can be modified, depending on the design specifications.

Figure 7:
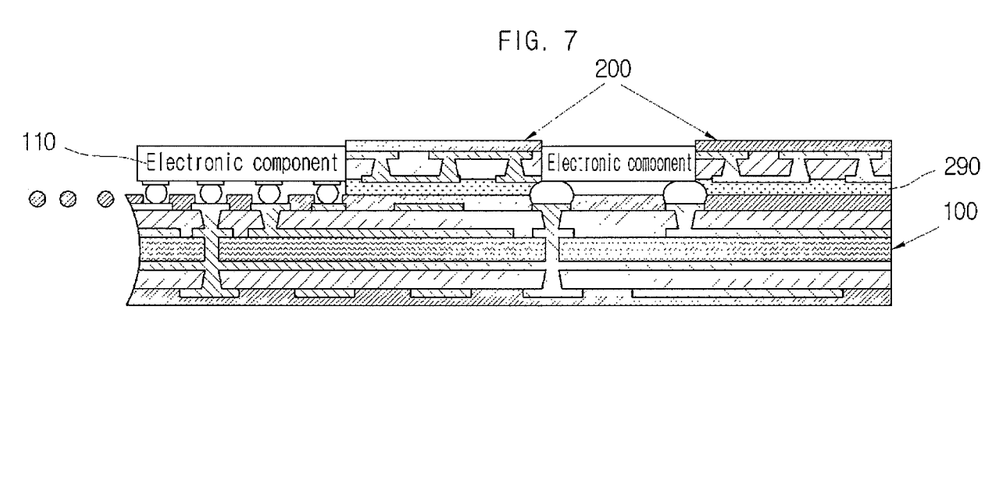

Meanwhile, if the problem is a noise radiated from a driving circuit around the electronic component 110, rather than a noise radiated from the upper surface of the electronic component 110 mounted on the first board 100, the second board 200 can have a portion that is opened corresponding to the position of the electronic component 110 and then be stacked on the upper surface of the first board 100. In this way, as illustrated in FIG. 7, the second board 200 can be interposed between every two electronic components 110, and thus the overall thickness of the printed circuit board can be prevented from unnecessarily becoming too thick.

Figure 8:
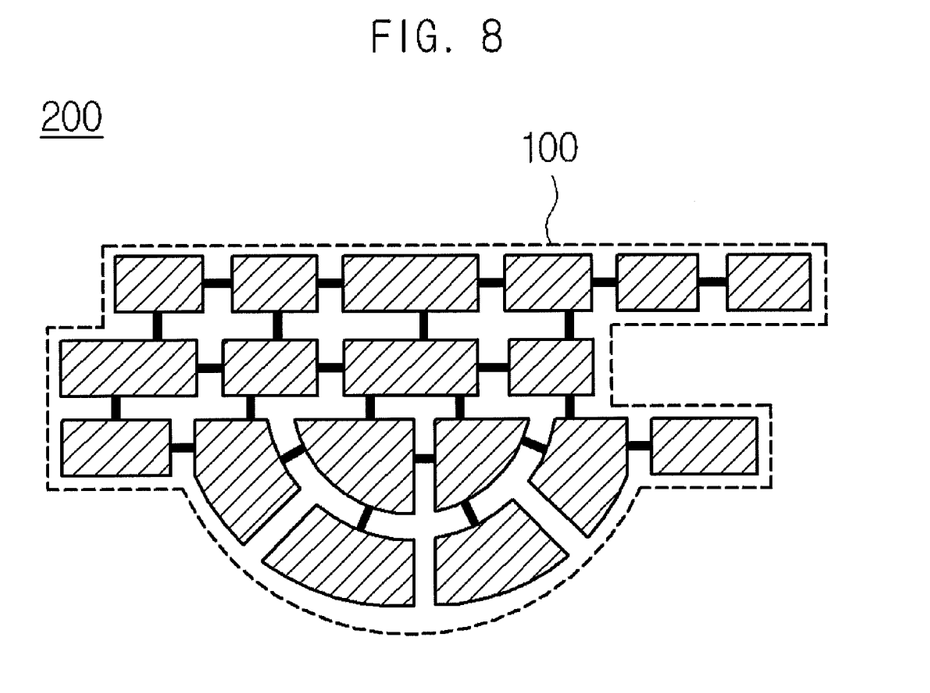
FIG. 8 is a plan view illustrating a second board of a printed circuit board in accordance with an embodiment of the present invention.

Meanwhile, if the first board 100 has a shape other than a rectangle, the second board 200 can also have a shape with its perimeter bent to correspond to the shape of the first board 100. For example, as illustrated in FIG. 8, a portion of the second board 200 can have a semicircular shape corresponding to the outer shape of the first board 100, or a triangle or the like, depending on the case.

Figure 9:
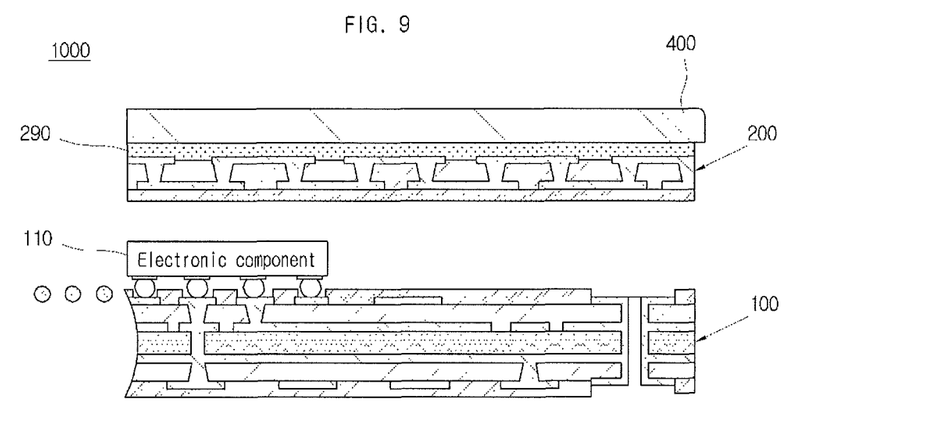
FIG. 9 is a cross-sectional view of an electronic product in accordance with an embodiment of the present invention.

The printed circuit board according the previously described embodiments of the present invention can be applied to various electronic products, such as mobile phones and other mobile devices. In this case, the above-described second board 200 can be coupled to the inside of a case 400 of an electronic product 1000, as illustrated in FIG. 9. In this case, the second board 200, into which the EBG structure is inserted, can be easily placed on the case 400 of the electronic product 1000 without having an additional shield can.

Next, various possible embodiments of the previously described EBG structure, which is inserted into the second board 200, will be described below.

Figure 10:
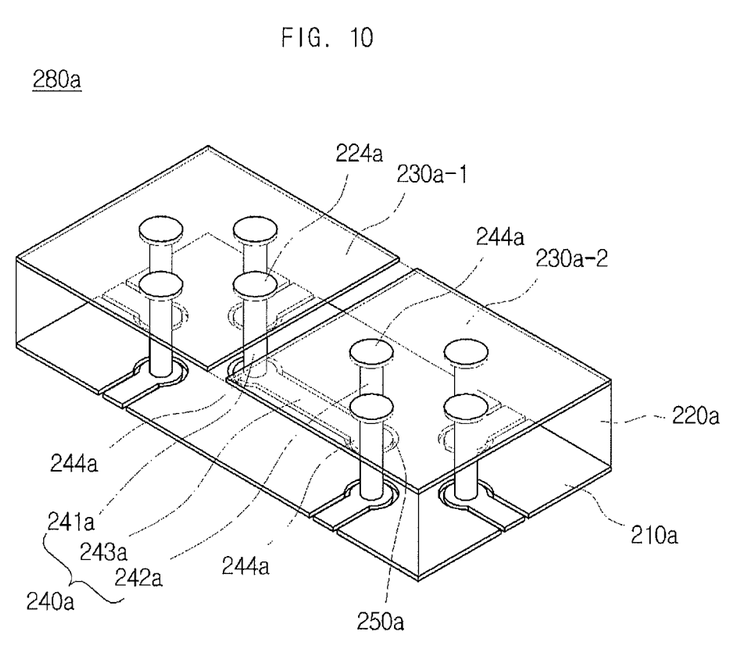
FIGS. 10 to 14 show EBG structures inserted in a printed circuit board in accordance with some embodiments of the present invention.

First of all, FIG. 10 shows a stitching via-type EBG structure. A bandgap structure 280a according to the present embodiment can include a first conductive body 230a-1 and a second conductive body 210a, each of which is disposed on a different surface, a third conductive body 230a-2, which is disposed on a surface that is different from that of the second conductive body 210a, a stitching via unit 240a, which connects the first conductive body 230a-1 to the third conductive body 230a-2 through the surface on which the second conductive body 210a is disposed but which is electrically separated from the second conductive body 210a.

Described below is the principle by which the structure shown in FIG. 10 can function as an electromagnetic bandgap structure blocking a signal of a certain frequency band. Interposed between the second conductive body 210a and the first and third conductive bodies 230a-1 and 230a-2 can be a dielectric layer 220a. This forms a capacitance component between the second conductive body 210a and the first and third conductive bodies 230a-1 and 230a-2 and between the adjacent first and third conductive bodies 230a-1 and 230a-2. In addition, an inductance component is formed between the two adjacent conductive bodies 230a-1 and 230a-2 by the stitching via unit 240a connecting through a first via 241a→a connection pattern 243a a second via 242a. Here, the value of the capacitance component can vary depending on various factors such as the spaced distances between the second conductive body 210a and the first and third conductive bodies 230a-1 and 230a-2 and between the two adjacent conductive bodies 230a-1 and 230a-2, the dielectric constant of a dielectric material forming the dielectric layer 220a and the size, shape and area of the conductive body. Also, the value of the inductance component can vary depending on various factors such as the shape, length, depth, width and area of the first via 241a, the second via 242a and the connection pattern 243a. Accordingly, adjusting and designing various aforementioned factors adequately can allow the structure of FIG. 10 to function as an electromagnetic bandgap structure (i.e. a band stop filter) for removing or blocking a certain noise or a certain signal of a target frequency band. This can be easily understood through the equivalent circuit of FIG. 11.

Figure 11:
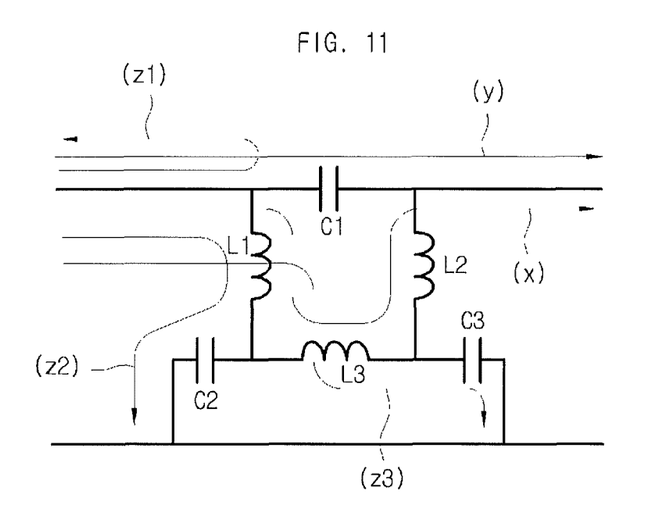

Comparing the equivalent circuit of FIG. 11 with the electromagnetic bandgap structure of FIG. 10, an inductance component L1 corresponds to the first via 241a, and an inductance component L2 corresponds to the second via 242a. An inductance component L3 corresponds to the connection pattern 243a. C1 is a capacitance component by the first and third conductive bodies 230a-1 and 230a-2 and any other dielectric layer that may be placed above the first and third conductive bodies 230a-1 and 230a-2 and the second conductive body 210a. C2 and C3 are capacitance components by the second conductive body 210a placed on the same planar surface as the connection pattern 243a and any other dielectric layer that may be placed below the planar surface of the connection pattern 243a and the second conductive body 210a.

The electromagnetic bandgap structure 280a shown in FIG. 10 can function as a band stop filter, which blocks a signal of a certain frequency band according to the above equivalent circuit. In other words, as seen in the equivalent circuit of FIG. 11, a signal in a low frequency band (refer to reference symbol "x" in FIG. 11) and a signal in a high frequency band (refer to reference symbol "y" in FIG. 11) can pass through the electromagnetic bandgap structure, and signals in a certain frequency band (refer to reference symbols "z1," "z2" and "z3" in FIG. 11) ranging between the low frequency band and the high frequency band are blocked by the electromagnetic bandgap structure.

Figure 12:
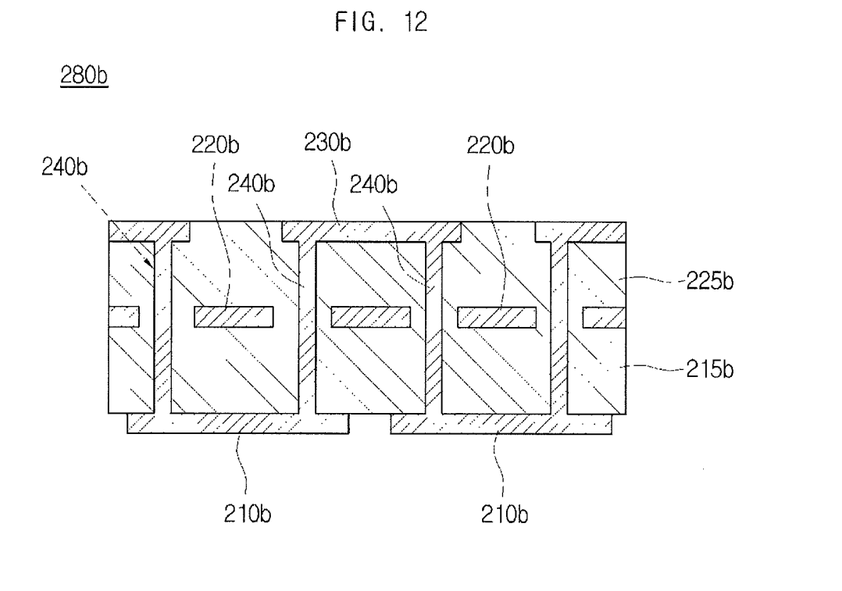

Illustrated in FIG. 12 is another embodiment of an EBG structure 280b that includes: a pair of fourth conductive bodies 210b, which are separately disposed on a same surface; a fifth conductive body 230b, which is disposed on a surface that is different from that of the fourth conductive bodies 210b; a sixth conductive body 220b, which is disposed on a surface between the fourth conductive bodies 210b and the fifth conductive body 230b; and a stitching via unit 240b, which connects the pair of fourth conductive bodies 210b to each other through the fifth conductive body 230b but is electrically separated from the sixth conductive body 220b.

In the EBG structure of FIG. 12, which is a modification of the EBG structure 280a of FIG. 10, an additional capacitance component is formed not only between the fourth conductive body 210b and the sixth conductive body 220b but also between the fifth conductive body 230b and the sixth conductive body 220b. Moreover, the via 240b connecting the fourth conductive body 210b to the fifth conductive body 230b can be long enough to obtain a sufficient value of the inductance component. Thus, the efficiency of blocking a signal in a certain frequency band can be improved.

Figure 13:
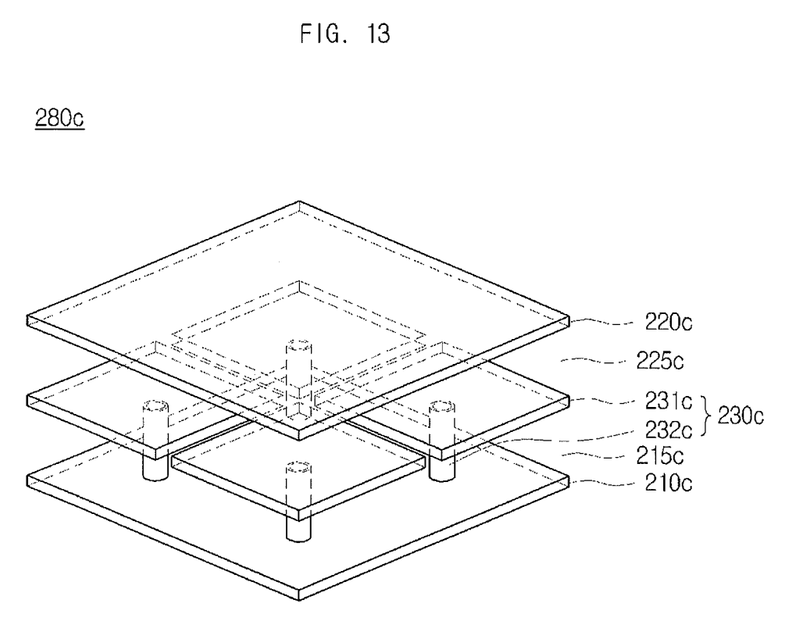

Illustrated as another embodiment of the present invention in FIG. 13 is a mushroom-type EBG 280c. The mushroom-type EBG 280c has a structure in which a plurality of mushroom-shaped EBG cells (refer to reference numeral 230c in FIG. 13) are interposed between two metal layers 210c and 220c that are to function as, for example, a power layer and a ground layer. FIG. 13 shows only four EBG cells 230c, for the convenience of illustration.

Referring to FIG. 13, in the mushroom-type EBG 280c, a metal plate 231c is additionally formed between a first metal layer 210c and a second metal layer 220c, each of which functions as the ground layer and the other of which functions as the power layer, and the mushroom type structures 230c connecting the first metal layer 210c to the metal plate 230c with a via 232c are repeatedly arranged. Here, a first dielectric layer 215c is interposed between the first metal layer 210c and the metal plate 231c, and a second dielectric layer 225c is interposed between the metal plate 231c and the second metal layer 220c.

In such mushroom-type EBG 280c, a capacitance component formed by the second metal layer 220c, the second dielectric layer 225c and the metal plate 231c and an inductance component formed by the via 232c connecting the first metal layer 210c to the metal plate 231c through the first dielectric layer 215c are connected in an L-C series between the first metal layer 210c and the second metal layer 220c, thereby allowing the mushroom-type EBG 280c to function as a type of band stop filter.

Figure 14:
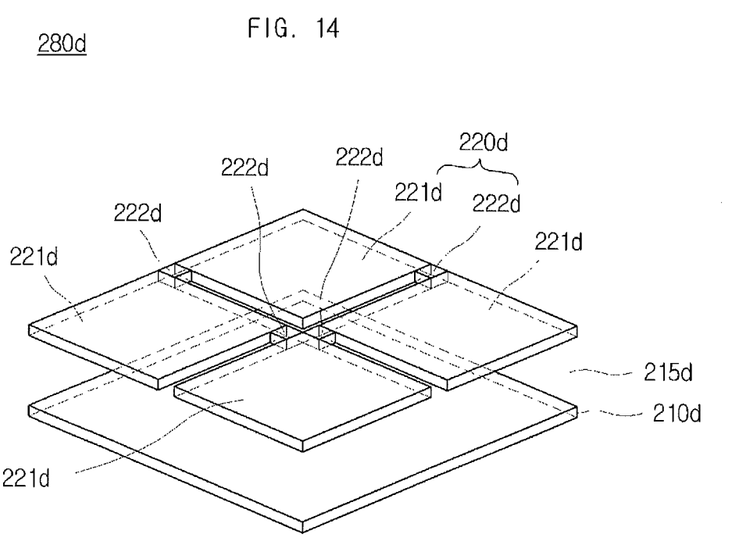

Illustrated as another embodiment of the present invention in FIG. 14 is a coplanar EBG 280d. In the coplanar EBG, a plurality of a certain pattern of EBG cells (refer to reference numeral 220d in FIG. 14) are repeatedly arranged throughout any metal layer that is to function as the power layer or the ground layer. FIG. 14 also shows only four EBG cells 220d, for the convenience of illustration.

Referring to FIG. 14, the coplanar EBG 280d has a form in which any metal layer 210d and a plurality of metal plates 221d, which are placed on another planar surface, are bridged to one another through a certain part of the metal plates (end of a corner of each metal plate in the case of FIG. 14) by metal branches 222d.

Here, the metal plates 221d having a large size constitute low impedance areas, and the metal branches having a small size constitute high impedance areas. Therefore, the coplanar EBG 280d becomes to function as a band stop filter that can block a noise in a certain frequency band through the structure in which the low impedance areas and the high impedance areas are alternately repeated.

Such coplanar EBG structure 280d has a merit that an electromagnetic bandgap structure can be constituted by using only two layers.

Although the EBG structure, which is inserted into the second board 200, has been described with four examples 280a, 280b, 280c and 280d, it shall be apparent that other modifications of the EBG structure can also be inserted into the second board 200.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. An electronic product comprising:
   a case;
   a first board placed inside the case; and
   a second board having an Electromagnetic Band Gap (EBG) structure inserted therein,
   wherein the second board is coupled to an inside of the case facing the first board so as to shield a noise radiated from the first board, and
   wherein a portion of a perimeter of the second board has a bent shape corresponding to a shape of a perimeter of the first board.

2. The electronic product of claim 1, wherein the second board comprises:
   a first conductive body and a second conductive body disposed on a different surface, respectively;
   a third conductive body disposed on a surface that is different from that of the second conductive body; and
   a stitching via unit connecting the first conductive body to the third conductive body through the surface on which the second conductive body is disposed, the stitching via being electrically separated from the second conductive body.

3. The electronic product of claim 1, wherein the second board comprises:
   a pair of fourth conductive bodies separately disposed on a same surface;
   a fifth conductive body disposed on a surface that is different from that of the fourth conductive bodies;
   a sixth conductive body disposed on a surface between the fourth conductive bodies and the fifth conductive body; and
   a stitching via unit connecting the pair of fourth conductive bodies to each other through the fifth conductive body, the stitching via unit being electrically separated from the sixth conductive body.

* * * * *